United States Patent [19]

Gunshor et al.

[11] 4,437,031
[45] Mar. 13, 1984

[54] ZNO SAW DEVICE HAVING SEPARATE COMB TRANSDUCER

[75] Inventors: Robert L. Gunshor; Robert F. Pierret, both of West Lafayette, Ind.; Michael R. Melloch, Mesquite, Tex.

[73] Assignee: Purdue Research Foundation, West Lafayette, Ind.

[21] Appl. No.: 431,683

[22] Filed: Sep. 30, 1982

[51] Int. Cl.$^3$ ............................................. H01L 41/04
[52] U.S. Cl. .............................. 310/313 B; 310/313 R; 333/154
[58] Field of Search ........... 310/313 B, 313 D, 313 L, 310/; 333/154, 193, 195

[56] References Cited

U.S. PATENT DOCUMENTS

| | | | |
|---|---|---|---|
| 3,768,032 | 10/1973 | Mitchell | 333/154 |
| 3,938,062 | 2/1976 | Hopp | 333/30 R |
| 4,117,074 | 9/1978 | Tiersten et al. | 310/320 |
| 4,209,725 | 6/1980 | Dieulesaint et al. | 310/313 |

*Primary Examiner*—J. D. Miller
*Assistant Examiner*—D. L. Rebsch
*Attorney, Agent, or Firm*—O'Rourke & Harris

[57] ABSTRACT

A separate comb transducer is disclosed in a ZnO/Si SAW device to enable doubling of the possible operating frequency for a given photolithographic capability of the device. Frequency doubling is made possible by a single-phase structure having conductive and non-conductive surfaces equal to one-half of the SAW wavelength. By connection of two such structures in parallel, a balanced separate comb transducer is achieved for reducing signal levels due to direct coupling that otherwise occurs in the single-phase structure. Separate comb grating transducers are also disclosed to enable fabrication of higher frequency MZOS convolvers, with both the separate comb transducer and separate comb grating transducer being shown utilized in both the Rayleigh and Sezawa modes.

9 Claims, 19 Drawing Figures

PRIOR ART

ZNO SAW DEVICE HAVING SEPARATE COMB TRANSDUCER

FIELD OF THE INVENTION

This invention relates to a separate comb transducer, and, more particularly, to a ZnO/Si SAW device having a single-phase transducer structure.

BACKGROUND OF THE INVENTION

Various suggestions and/or devices have heretofore been presented for exciting and detecting a surface acoustic wave (SAW) on a piezoelectric media. In addition, use has heretofore been made of such devices in convolvers.

Heretofore, a device known as the interdigital transducer (IDT) has been the most efficient device found for exciting and detecting such waves, and a configuration utilizing a two-layer transducer on lithium niobate has been heretofore used for doubling the frequency range for $LiNbO_3$ SAW devices. In addition, while various other grating array transducer schemes have been suggested and/or demonstrated on single crystal structures, such schemes have not been found to be completely acceptable, due, at least in part, to unacceptable degration in such transducers.

The conventional interdigital transducer, however, has likewise not been found to be completely acceptable, in that such transducers require metal widths and spacings of one quarter of the wavelength of the SAW device, and presents yield disadvantages, at least in some instances, including use in convolvers.

SUMMARY OF THE INVENTION

This invention provides a single comb transducer that is particularly useful in a ZnO/Si SAW device. Through use of a single-phase structure with conductive and non-conductive surface spaces having a wavelength of $\lambda/2$, where $\lambda$ is the SAW wavelength, the operating frequency can be double that of the interdigital transducer which conventionally depends upon widths and spacings of $\lambda/4$. By connection of two single-phase structures in parallel, a balanced separate comb transducer is achieved which reduces high signal levels due to direct coupling that otherwise occurs in single-phase structures, and convolvers have been constructed using such structures that operate at higher frequencies in both the Rayleigh and Sezawa modes.

It is therefore an object of this invention to provide a separate comb transducer.

It is another object of this invention to provide a separate comb transducer that is particularly useful in a ZnO/Si SAW device.

It is still another object of this invention to provide a separate comb transducer having a single-phase structure.

It is still another object of this invention to provide a separate comb transducer for a SAW device having a single-phase structure with conductive and non-conductive surface spacings equal to one-half of the wavelength of the SAW device.

It is yet another object of this invention to provide a balanced separate comb transducer.

It is still another object of this invention to provide a balanced separate comb transducer having parallel single-phase structures.

It is still another object of this invention to provide a separate comb transducer in a grating configuration.

It is still another object of this invention to provide a ZnO/Si SAW device having separate comb transducers.

It is yet another object of this invention to provide a ZnO/Si SAW device having balanced separate comb transducers with parallel single-phase structures.

It is yet another object of this invention to provide a convolver utilizing separate comb transducers.

With these and other objects in view, which will become apparent to one skilled in the art as the description proceeds, this invention resides in the novel construction, combination, and arrangement of parts substantially as hereinafter described, and more particularly defined by the appended claims, it being understood that such changes in the precise embodiment of the herein disclosed invention are meant to be included as come within the scope of the claims.

BRIEF DESCRIPTION OF THE DRAWINGS

The accompanying drawings illustrate complete embodiments of the invention according to the best mode so far devised for the practical application of the principles thereof, and in which.

DESCRIPTION OF THE INVENTION

As brought out hereinabove, an interdigital transducer configuration has heretofore been used for exciting and detecting a surface acoustic wave (SAW) on a piezoelectric medium.

Figure 1:
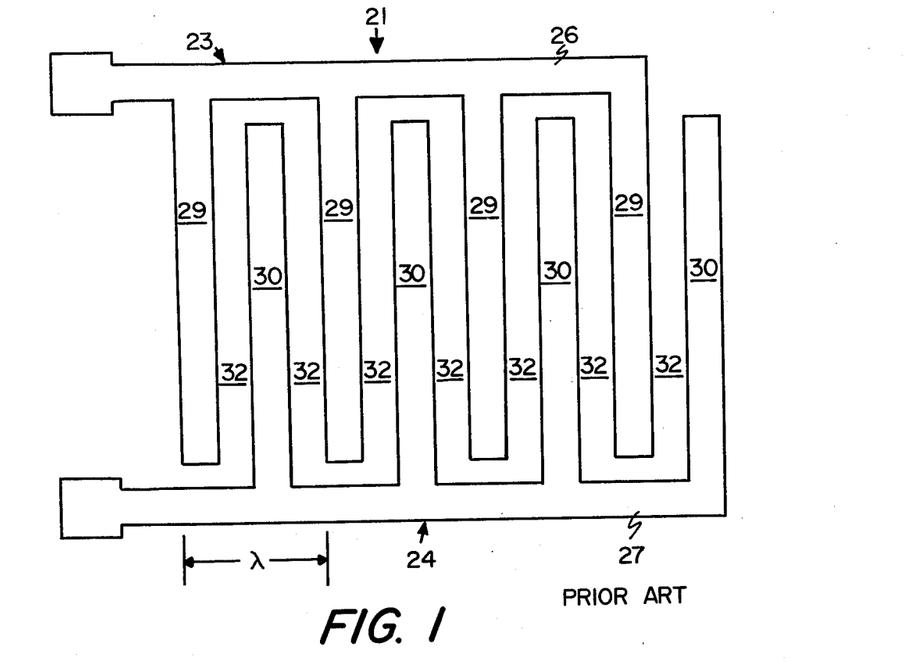
FIG. 1 is a top view of a known interdigital transducer configuration.

As shown in FIG. 1, conventional interdigital transducer 21 consists essentially of two conductive (metal) portions 23 and 24, each of which includes an arm (designated 26 and 27, respectively) with each arm having a plurality of fingers 29 and 30, respectively, which fingers extend from the arm and are alternately spaced with respect to one another along a surface so that equal non-conductive spaces 32 exist between the fingers. As indicated in FIG. 1, each of the conductive (metal) fingers and each spacing therebetween is equal to $\lambda/4$ where $\lambda$ is the SAW wavelength.

Figure 2A:
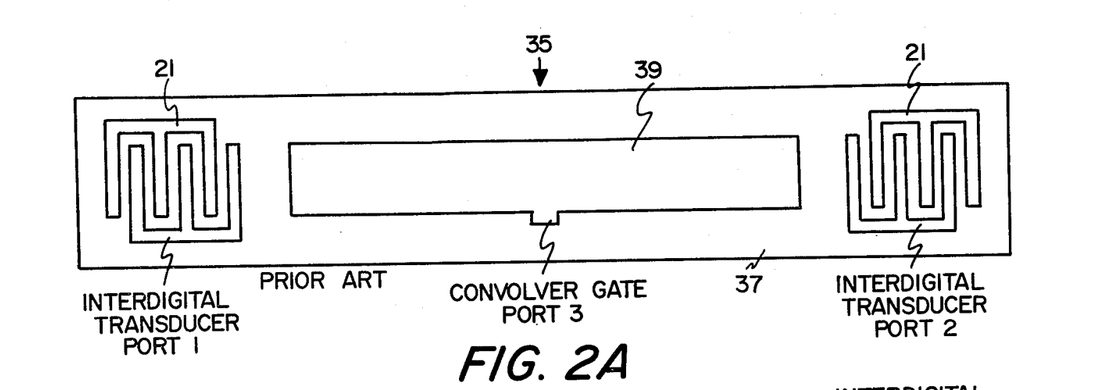
FIG. 2A is a top view of a known $LiNbO_3$ convolver configuration utilizing interdigital transducers as shown in FIG. 1.
Figure 2B:
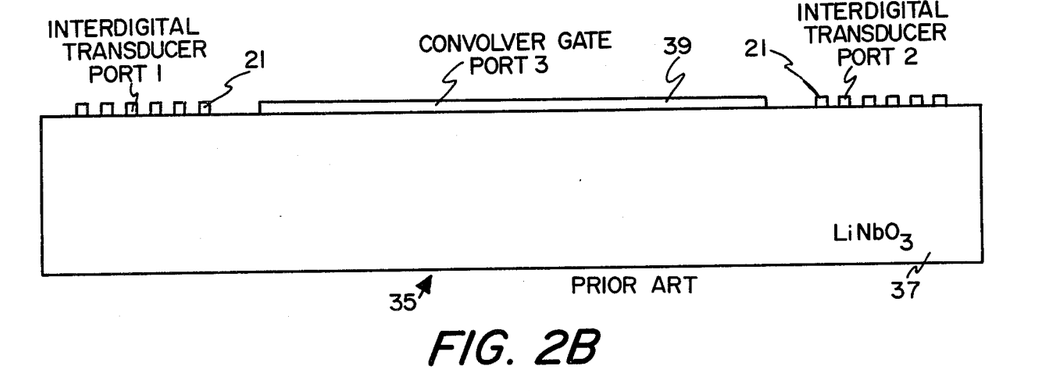
FIG. 2B is a side view of the convolver configuration shown in FIG. 2A.

A conventional surface acoustic wave (SAW) convolver 35, using interdigital transducers 21, is shown in FIGS. 2A and 2B with the conductive elements (i.e., the transducers and convolver gate) being positioned on a LiNbO$_3$ substrate, or medium, 37. As shown, the convolver is a three port device (wherein the transducers 21 are positioned at opposite sides of a convolver gate 39) that is used for signal processing applications. When two rf modulated signals, $V_1(t)$ and $V_2(t)$ (within certain bandwidth and time restrictions), are applied to ports 1 and 2 (the interdigital transducers), two contrapropagating SAWs are launched. As the two waves pass each other, some nonlinearity in the device (depending upon the type of device being used) gives rise to a third signal whose integration is the convolution of these two signals compressed in time by a factor of two and appearing at port 3 (the convolver gate).

Since the output of a linear filter is the convolution of the filter's impulse response with the input waveform, if $V_1(t)$ is considered the input waveform and $V_2(t)$ is considered an impulse response, then the SAW convolver can be regarded as a programmable filter. This programmability is one of the reasons which has made SAW convolvers an attractive component for both spread spectrum and radar systems.

By choosing the signal $V_2(t)$ such that $V_2(t)$ equals $V_1(-t)$, then the SAW convolver is operated as a matched filter. If a signal is transmitted in a radar system, for example, the maximum signal-to-noise ratio at the decision instant is obtained by using a matched filter. This use of matched filtering techniques offers one increased range for a given range resolution without an increase in the peak transmitter power.

As also mentioned, the SAW convolver can be a component in a spread spectrum communication system. Spread spectrum communication techniques are used for reliable digital data transmission in the presence of strong jamming or interference. In a normal system, without spread spectrum, a digital signal of duration T is transmitted in a bandwidth BW=2/T. The idea behind spread spectrum is to change the digital data symbol by some predetermined rule such as linear frequency modulation, phase modulation of data bits, hopping of the carrier frequency, etc., and thus increase the transmission bandwidth.

Figure 3:
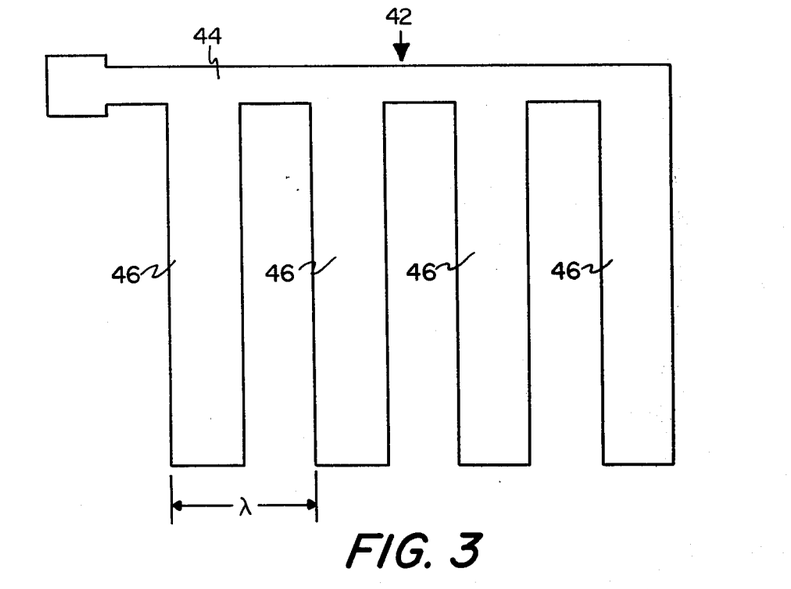
FIG. 3 is a top view of a single-phase transducer with conductive and non-conductive widths of $\lambda/2$.

The upper limit of the operating frequency of a SAW device is determined by the capability of the photolithographic technique being used to define the transducer. A new transducer configuration, called the separate comb transducer, is presented herein which utilizes a single-phase configuration, as shown in FIG. 3, which doubles the operating frequency possible for a given photolithographic capability, which increase is due to the metal widths and spacings for the separate comb transducer being $\lambda/2$ (where $\lambda$ equals wavelength of the SAW) (as compared with the metal widths and spacings for the conventional IDT structure which is $\lambda/4$). In addition, the separate comb transducer also has yield advantages as compared with the interdigital transducer, and as brought out hereinafter, the separate comb transducer has been utilized to realize higher frequency MZOS convolvers than previously known.

As shown in FIG. 3, single-phase transducer 42 includes a conductive (metal) arm 44 having a plurality of conductive (metal) fingers 46 extending from the arm. As indicated, the spacing between the fingers, as well as the width of each finger is $\lambda/2$ where $\lambda$ is the SAW wavelength. Thus, for a given photolithographic limit, one can obtain twice the operating frequency with a single-phase structure (as shown in FIG. 3) as opposed to the prior art IDT structure (as shown in FIG. 1).

Figure 4:
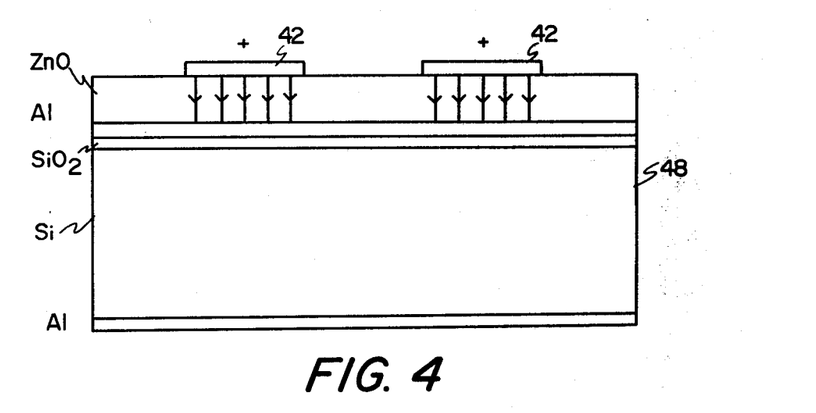
FIG. 4 is a side schematic view to illustrate typical electric field patterns for MZOS single-phase transducers.

A side view of the single-phase transducer 42 in a metal ZnO silicon layered configuration 48 (MZOS structure) is shown in FIG. 4. The underlay at the ZnO-SiO$_2$ interface acts as a shorting plane. Therefore, the electric fields are mainly in-line since a thickness of the ZnO is typically three to ten times smaller than the interelectrode spacing.

Figure 5:
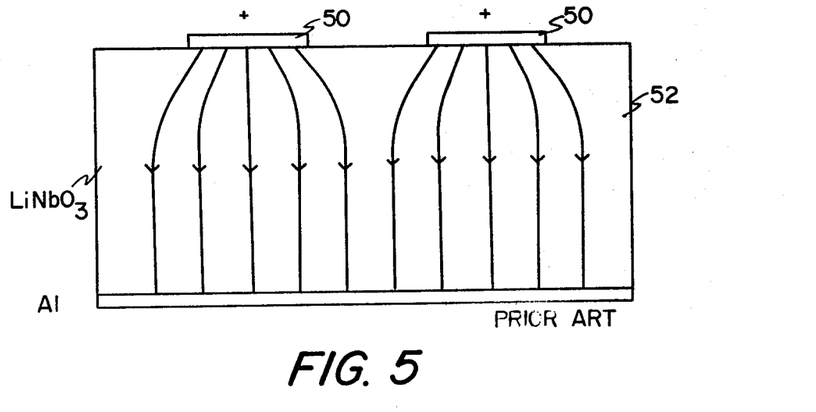
FIG. 5 is a side schematic view to illustrate typical electric field patterns for the single-phase $LiNbO_3$ transducers.

In contrast, the interelectrode spacing for the single crystal grating transducers is much smaller than the crystal thickness. Therefore, much fringing of the electric fields occur as depicted in FIG. 5, showing, by way of example, a single-phase LiNbO$_3$ transducer wherein the transducer 50 is shown positioned on a LiNbO$_3$ substrate 52. It is this inherent difference in field patterns between the layered and crystal structures which makes the single-phase transducer in the layered configuration much more efficient than its counterpart in the single-crystal configuration.

Figure 6:
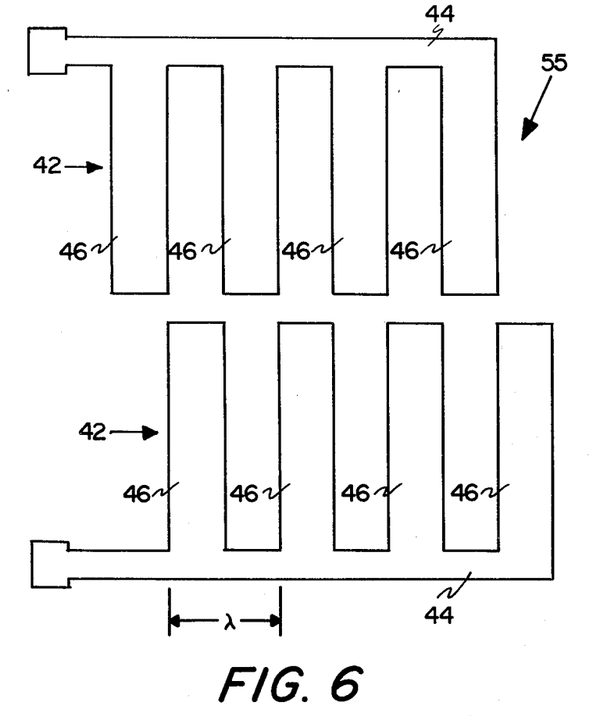
FIG. 6 is a top view illustrating parallel positioning of single-phase structures to achieve a separate comb transducer.

Separate comb transducer 55 is shown in FIG. 6 to include a pair of single-phase transducers 42 positioned parallel to one another with the fingers 46 offset (i.e., the fingers of one transducer 42 are aligned with the spaces between the fingers of the other transducer 42).

For purposes of this invention, a Rayleigh single mode phase transducer delay line was constructed in the ZnO/SiO$_2$/Si configuration. The Rayleigh waves were propagated in the silicon <100> direction on a (100) cut 7 $\Omega$-cm n-silicon substrate. A 0.12 $\mu$m SiO$_2$ film thermally grown on the silicon substrate was covered with a 2.6 $\mu$m thick ZnO film deposited by rf sputtering. The transducers consisted of 20 aluminum fingers of equal width and gap (22.9 $\mu$m) located on top of the ZnO, with the aluminum underlay positioned at the ZnO-SiO$_2$ interface. The SAW acoustic beamwidth was 1 mm and the center-to-center transducer spacing was 12.7 mm. Both input and output transducers were tuned with series inductors and there was a convolver gate located between the transducers.

Figure 7:
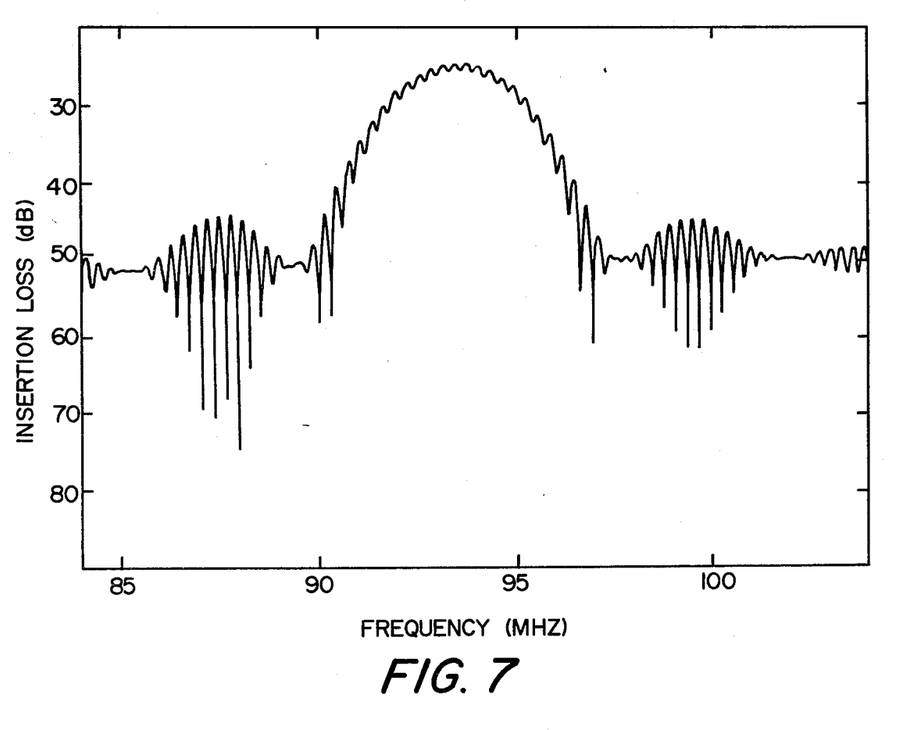
FIG. 7 is a typical trace illustrating two-port insertion loss versus frequency for a single-phase transducer Rayleigh mode device.

FIG. 7 shows the two port insertion loss for the Rayleigh device plotted as a function of frequency. The insertion loss at the synchronous frequency, $f_o=94$ MHz, is 25 dB. This loss value is comparable to that achieved with other MZOS Rayleigh delay lines. However, it was found that the background signal level, due to direct electromagnetic coupling between the single-phase transducers, is only 25 dB below the response peak. In the conventional IDT structure, this direct coupling is often reduced by means of a balanced excitation, which is implemented by driving both combs with signals that have 180 degree phase offset.

Figure 8:
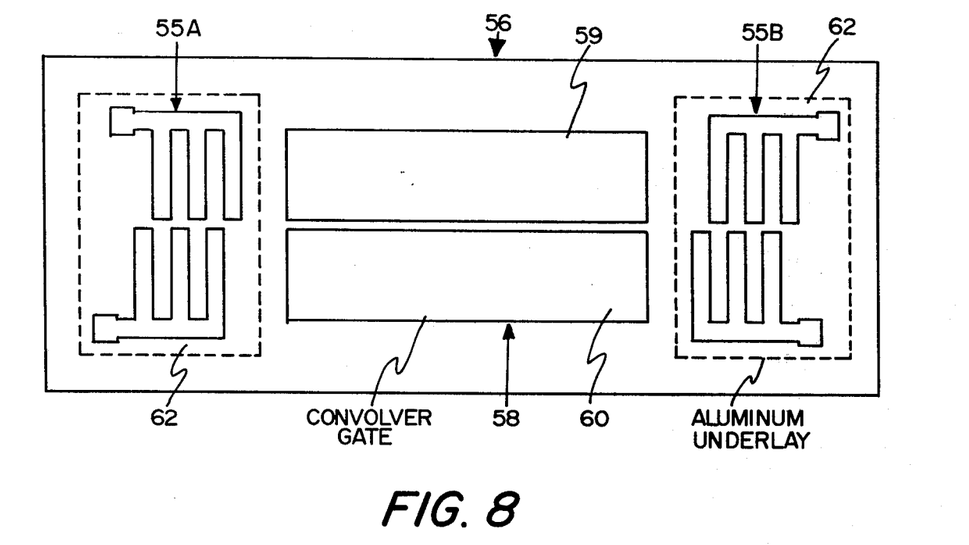
FIG. 8 is a top view of a separate comb transducer convolver configuration.

In this invention, it has been found that a balanced drive can be realized by placing two single-phase delay lines in parallel as shown in FIG. 8 to form separate comb transducer (SCT) convolver 56 as shown in FIG. 8. As shown, two separate comb transducers 55A and 55B are positioned between convolver gate 58 made up of two parallel conductors (metal) delay line strips 59 and 60, with each separate comb transducer having an aluminum underlay 62.

Figure 9:
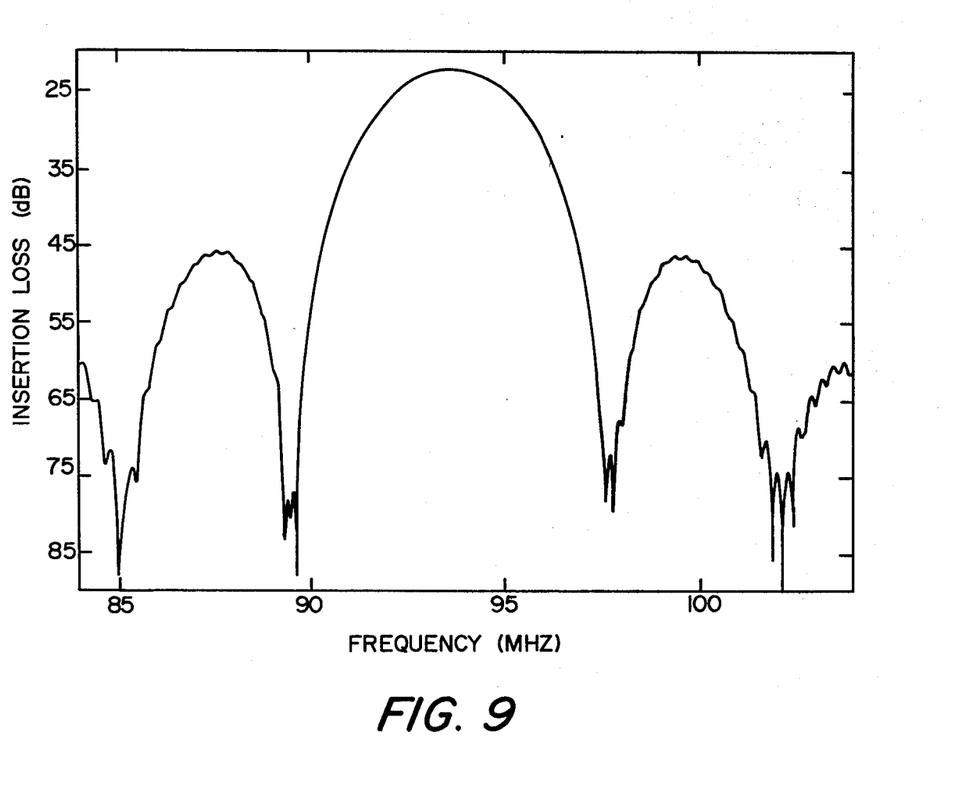
FIG. 9 is a typical trace illustrating two-port insertion loss versus frequency for a separate comb transducer Rayleigh mode device.

FIG. 9 shows the two port insertion loss for a balanced separate comb Rayleigh device as shown in FIG. 8. All the parameters are the same as those previously described in connection with the Rayleigh device having the two-port insertion loss, as shown in FIG. 7, except that the combined beamwidth is now 2 mm and there are two convolver gates 59 and 60, one between each half of the transducers (as shown in FIG. 8). The synchronous insertion loss is 22 dB and the background noise level is now 60 dB below the peak transduction. It should be noted that this structure is similar in complexity to a convolver configuration used to obtain self-convolution suppression. Self convolution is the unwanted signal due to reflections off the transducers. One method of eliminating it is to have two acoustic tracks with the transducers at one end of the tracks being constructed in phase while those at the other end are constructed 180 degrees out of phase so that the two convolver outputs are therefore 180 degrees out of phase and can be combined from the two gates with a balanced to unbalanced transducer. The symmetrical waves will not cause a reflection from the asymmetrical transducer while the asymmetrical wave will not cause a reflection from the symmetrical transducer. Thus, it follows that the self-convolution output will be eliminated.

In addition to the Rayleigh device, a Sezawa mode balanced separate comb transducer delay line was also constructed. The parameters were the same as for the balanced separate comb Rayleigh device except that the ZnO film was 10 μm thick, and was deposited by rf magnetron sputtering.

Figure 10:
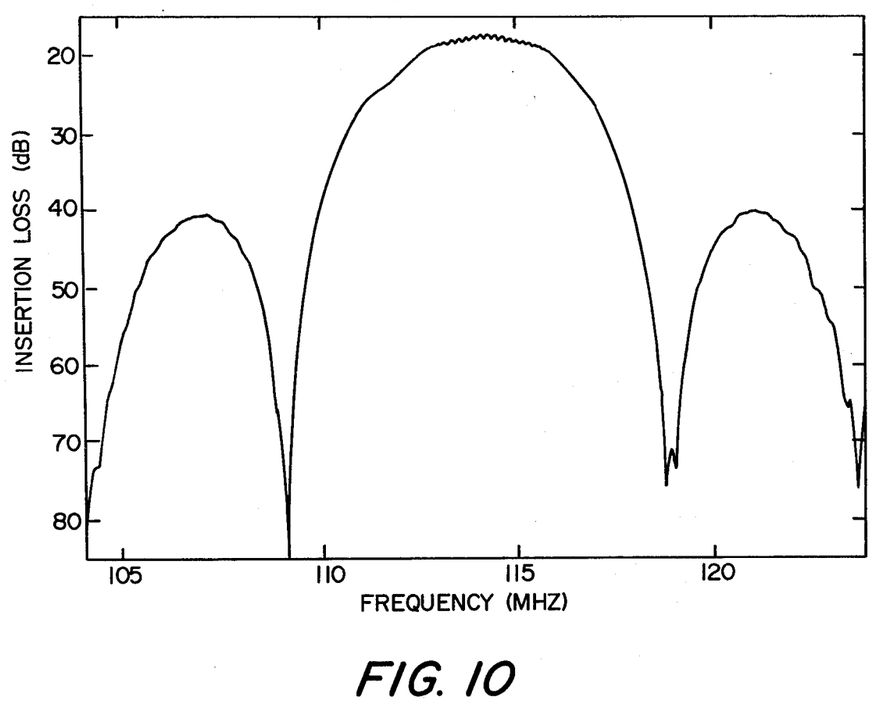
FIG. 10 is a typical trace illustrating two-port insertion loss versus frequency for a separate comb transducer Sezawa mode device.

The two port insertion loss for the Sezawa device, plotted as a function of frequency, is shown in FIG. 10. The insertion loss at the synchronous frequency $f_o=114.5$ MHz, is 18 dB, a value comparable with other MZOS Sezawa delay lines.

The comparison of interdigital transducers in the MZOS structure, under balanced and unbalanced excitation, has been heretofore examined both experimentally and theoretically. The single phase and separate comb transducers can be compared to the IDT by using the normal mode approach. For the MZOS structure, the radiation resistance, $R_a$, and the static capacitance, $C_T$, for a balanced drive IDT are:

$$R_a = \frac{4}{\omega l} \left( \frac{\sin \frac{\pi d}{\lambda}}{\frac{\pi d}{\lambda}} \right)^2 \frac{1}{\epsilon_o + (\epsilon_{xx}\epsilon_{zz})^{\frac{1}{2}} ctnh \left( \left( \frac{2\pi}{\lambda} \right) \left( \frac{\epsilon_{xx}}{\epsilon_{zz}} \right)^{\frac{1}{2}} H \right)} \frac{\Delta v}{v} \quad (1)$$

$$C_T = N\pi l \left[ 4 \sum_{m=0}^{\infty} \left( \frac{\sin[(2m+1)\pi d/\lambda]}{(2m+1)\pi d/\lambda} \right)^2 \times \frac{1}{(2m+1)\left[ \epsilon_o + (\epsilon_{xx}\epsilon_{zz})^{\frac{1}{2}} ctnh \left[ 2\pi \frac{(2m+1)}{\lambda} \left( \frac{\epsilon_{xx}}{\epsilon_{zz}} \right)^{\frac{1}{2}} H \right] \right]} \right]^{-1} \quad (2)$$

where,
N=number of finger pairs
d=finger width
l=finger length
v=wave velocity
Δv=perturbation in wave velocity
H=ZnO thickness
λ=acoustic wavelength
ω=synchronous frequency
$\epsilon_{xx},\epsilon_{zz}$=permittivities for ZnO The normal mode approach applied to the balanced separate comb transducer for evaluation of the radiation resistance and static capacitance gave the same results as equations (1) and (2).

Equations (1) and (2) can be used to make a comparison between a balanced separate comb transducer having N fingers in each parallel half of the transducer, and an IDT having N finger pairs and operated with balanced drive. In both examples, the finger-width-to-spacing-ratio is taken as unity, and they have the same beamwidth. It has been found that the balanced separate comb transducer had the same radiation resistance and static capacitance as the IDT structure using balanced excitation. Therefore, the electrical fractional bandwidth, given by $\Delta f/f_o = 2f_o C_T R_a$, is the same for the balanced separate comb and balanced IDT structures.

The radiation resistance of the above described balanced separate comb Rayleigh device was measured to be 16.5 ohms. The value of $R_a$ obtained from equation (1) was 19.4 ohms. The measured static capacitance was 8 pf, while a value of 9.5 pf was obtained from equation (2). Thus, only a slight disagreement exists between experimental and theoretical values.

Using the normal mode approach, the radiation resistance and static capacitance for the single phase transducer and the IDT driven unbalanced are:

$$R_a = \frac{1}{\omega 1}\left(\frac{\sin\frac{\pi d}{\lambda}}{\frac{\pi d}{\lambda}}\right)^2 \frac{1}{\left[\epsilon_o + (\epsilon_{xx}\epsilon_{zz})^{\frac{1}{2}}ctnh\left(\frac{2\pi}{\lambda}\right)\left(\frac{\epsilon_{xx}}{\epsilon_{zz}}\right)^{\frac{1}{2}}H\right)\right]} \frac{\Delta v}{v} \quad (3)$$

$$C_T = \frac{\pi N 1}{\left[\frac{\pi H}{\lambda \epsilon_{zz}} + \sum_{m=1}^{\infty}\left(\frac{\sin\frac{m\pi d}{\lambda}}{\frac{m\pi d}{\lambda}}\right)^2 \frac{1}{m\left[\epsilon_o + (\epsilon_{xx}\epsilon_{zz})^{\frac{1}{2}}ctnh\left(m\frac{2\pi}{\lambda}\left(\frac{\epsilon_{xx}}{\epsilon_{zz}}\right)^{\frac{1}{2}}H\right)\right]}\right]} \quad (4)$$

Using equations (3) and (4), a comparison can be made between a single-phase transducer of N fingers and an IDT of N finger pairs that is driven unbalanced. The ratio of finger width to spacing was taken as unity for both transducers, and they have the same beamwidth. For the single-phase structure, the radiation resistance is found to be one-half and the static capacitance is twice that of the unbalanced IDT structure. Therefore, the electrical fractional bandwidth, $\Delta f/f_o = 2f_o C_T R_a$, is the same for the single phase structure and the IDT structure with unbalanced drive.

The radiation resistance of the previously described single phase Rayleigh device was measured to be 4 ohms. The value of $R_a$ obtained from equation (3) is 4.8 ohms. The measured static capacitance was 14 pf, while a value of 17.5 pf is obtained from equation (4).

Figure 11:
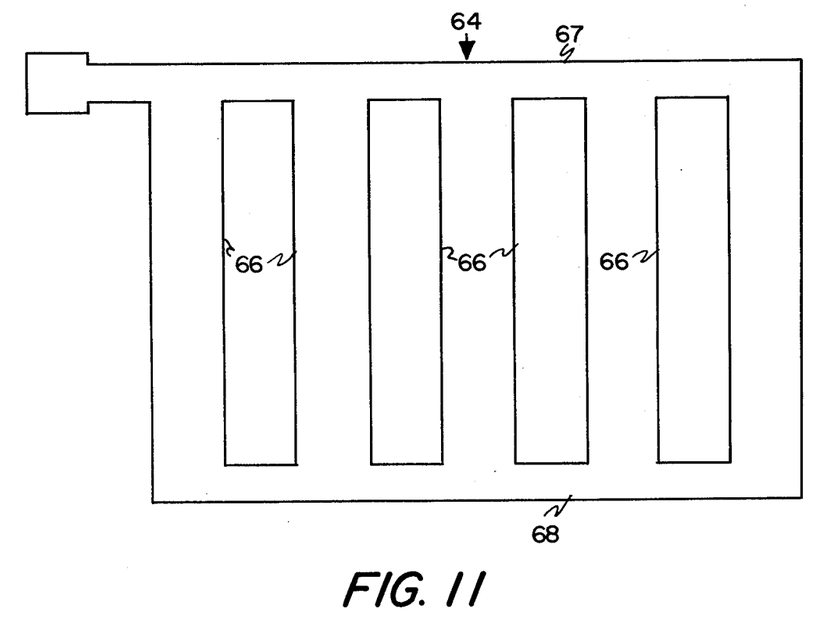
FIG. 11 is a top view of a single-phase grating transducer.

A single-phase transducer in the form of a grating, as shown in FIG. 11, can also be utilized as a separate comb transducer in this invention. As shown, separate comb grating transducer 64 includes a plurality of spaced fingers 66 joined at each end by arms 67 and 68 with arms 67 and 68 being in conductive engagement with each finger. As shown, the arms and fingers can be integrally formed if desired (as can the arms and fingers of the other single-phase transducers shown).

A single-phase transducer in the form of a grating in the MZOS configuration improves device yields. Not only are minimum metal widths and spacing twice that of conventional IDT structure, electrical shorts between fingers will alter just a small portion of the transducer's active region (unlike the conventional interdigital transducer where an electric short would make the transducer useless). In addition, a single break in a grating finger will effect only a small portion of the transducer's active region since the electrical signal is fed to each finger from both ends.

The separate comb grating transducer (SCGT), like the separate comb transducer (SCT), in the MZOS SAW configuration, enables doubling of the operating frequency for a given photolithographic capability. As described above, the increase is due to the metal widths and spacings being $\lambda/2$ (rather than $\lambda/4$ for the conventional IDT). The separate comb grating transducer 64 has also been employed in the construction of high frequency Rayleigh and Sezawa convolvers in the MZOS structure.

Figure 12:
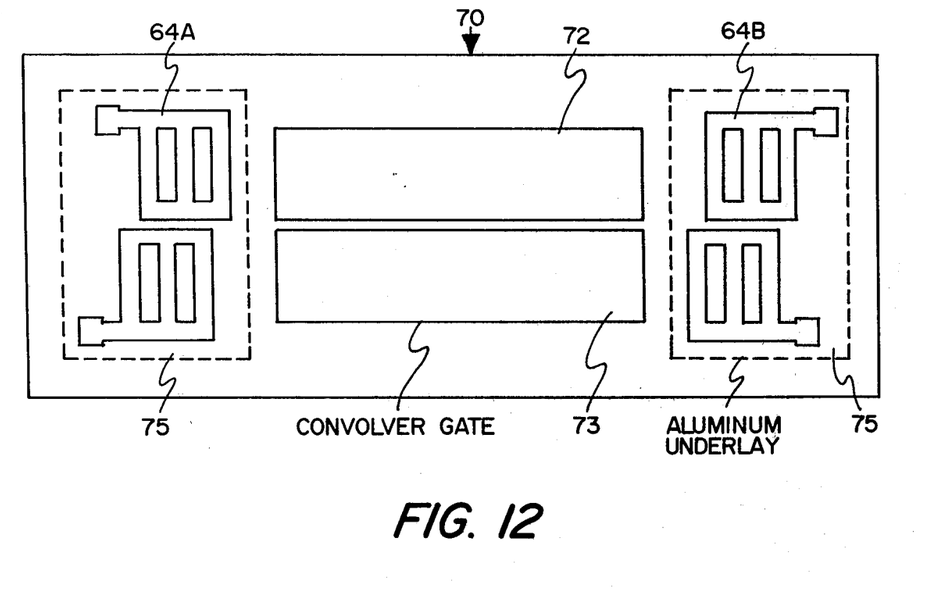
FIG. 12 is a top view of a separate comb grating transducer convolver configuration.

The basic convolver structure 70 using separate comb grating transducers is shown in FIG. 12. Two convolver gates 72 and 73 are used, with each being spaced from different portions of separate comb grating transducers 64A and 64B, each of which has an aluminum underlay 75. This configuration, with an appropriate shift in transducer position, can be used to obtain self-convolution suppression. The devices were fabricated on (100) cut 7 $\Omega$-cm n-silicon substrates and the silicon SAW propagation was in the <100> direction. A 0.12 $\mu$m $SiO_2$ film was thermally grown on the silicon substrate and then 0.6 $\mu$m or 2.8 $\mu$m of ZnO was deposited by rf sputtering for the Rayleigh and Sezawa devices, respectively. The single comb grating transducer consisted of 20 aluminum fingers in each half of the transducer designed for a wavelength of 15.24 $\mu$m. The SAW beamwidth was 0.15 cm and the center-to-center transducer spacing was 1.27 cm. The transducers were driven balanced and the convolution was taken from both convolver gates.

Figure 13:
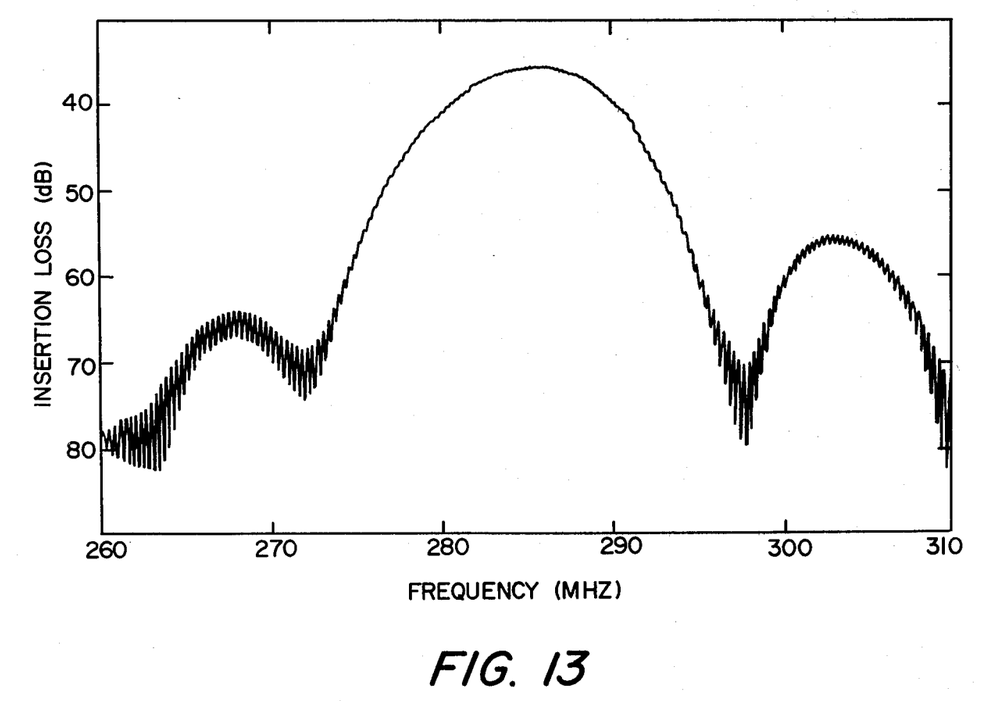
FIG. 13 is a typical trace illustrating two-port insertion loss versus frequency for a 285 MHz synchronous frequency separate comb grating transducer Rayleigh mode device.
Figure 14:
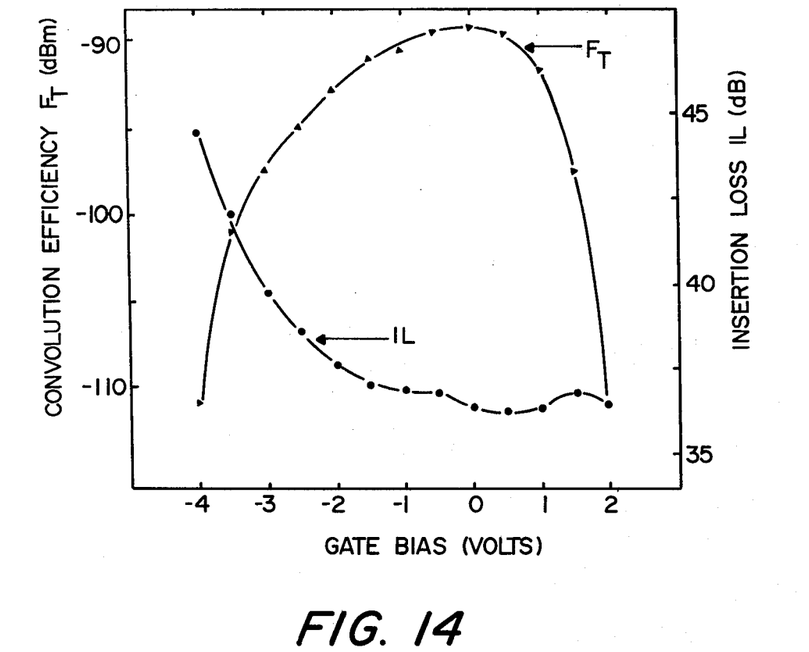
FIG. 14 is a graph illustrating convolver efficiency and two-port insertion loss versus DC gate bias for a separate comb grating transducer Rayleigh mode convolver where the frequency is 285 MHz.
Figure 15:
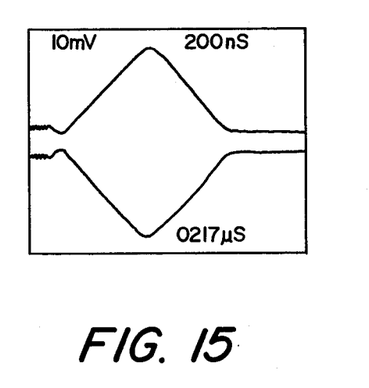
FIG. 15 is a typical trace illustrating convolver output at 570 MHz of two rectangular pulses for a separate comb grating transducer Rayleigh mode device with horizontal axis of 200 nsec/div.

The Rayleigh convolver, fabricated as above set forth, had a synchronous frequency of $f_o = 285$ MHz and two-port insertion loss of 36 dB. This synchronous frequency is more than 100 MHz higher than any known MZOS Rayleigh convolver. The frequency response of this device is shown in FIG. 13. A maximum convolution efficiency of $f_T = -89$ dBm was obtained and the convolution efficiency and insertion loss versus gate bias are shown in FIG. 14. A stationary state was established at each bias value, while the actual convolution efficiency and insertion loss measurements were taken in the dark. The convolution output at 570 MHz for two rf modulated rectangular pulses is shown in FIG. 15.

Figure 16:
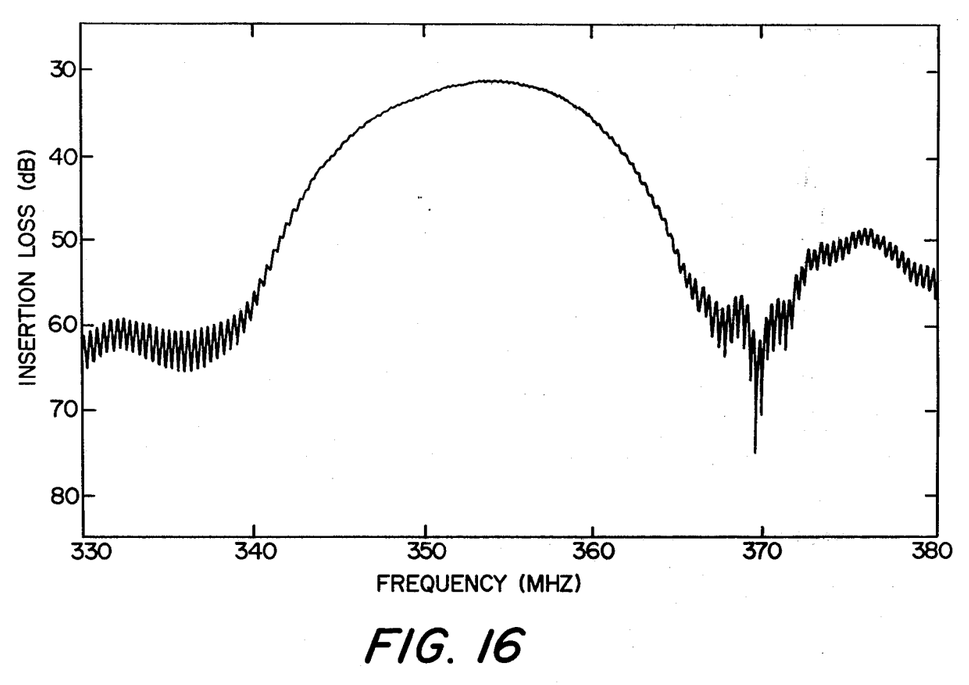
FIG. 16 is a typical trace illustrating two-port insertion loss versus frequency for a 355 MHz synchronous frequency separate comb grating transducer Sezawa mode device.
Figure 17:
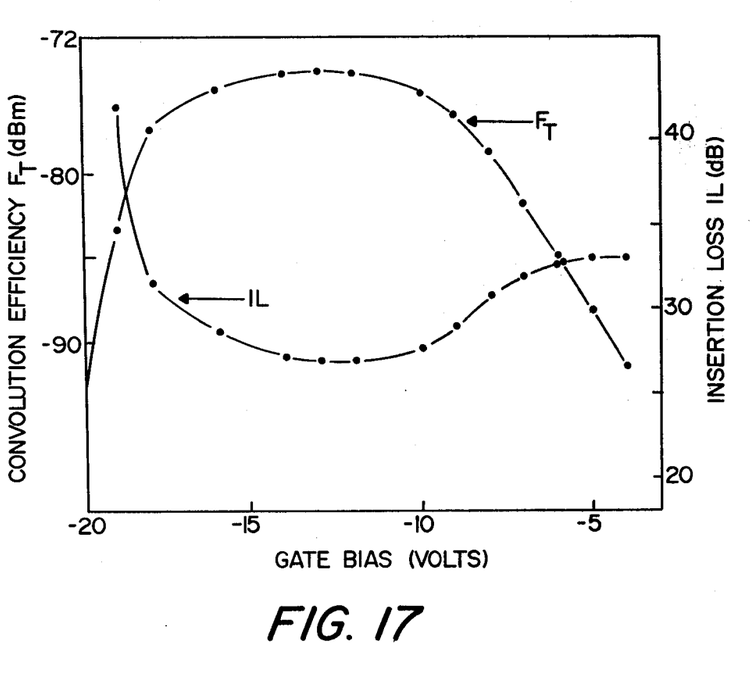
FIG. 17 is a graph illustrating convolver efficiency and two port insertion loss versus DC gate bias for a separate comb grating transducer Sezawa mode convolver where the frequency is 355 MHz.
Figure 18:
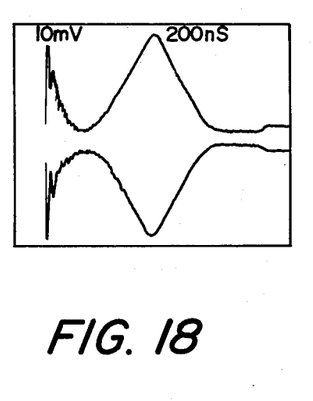
FIG. 18 is a typical trace illustrating convolver output at 710 MHz of two rectangular pulses for a separate comb grating transducer Sezawa mode device with horizontal axis of 200 nsec/div.

A fabricated Sezawa convolver had a synchronous frequency of $f_o = 355$ MHz and two port insertion loss of 27 dB. This synchronous frequency is 130 MHz higher than any known MZOS Sezawa convolver. The frequency response for this device is shown in FIG. 16. A maximum convolution efficiency of $f_T = -74$ dBm was obtained and the convolution efficiency and insertion loss versus gate bias are shown in FIG. 17. The convolution output at 710 MHz for two rf modulated rectangular pulses is shown in FIG. 18.

As can be appreciated from the foregoing, this invention provides a separate comb transducer that enables doubling of the operating frequency for both MZOS Rayleigh and Sezawa mode transducers without an increase in conversion loss, or in the amount of direct coupling.

What is claimed is:

1. A separate comb transducer for use in a device having a surface acoustic wave coupled thereto, said transducer comprising first and second conductive elements each of which includes an arm and a plurality of fingers extending from said arm, said fingers being substantially parallel to and spaced from one another with the width of said fingers and the spacing therebetween each being substantially equal to one-half of the wavelength of said surface acoustic wave, and said elements being positioned with the fingers of each element substantially parallel to the fingers of the other element with the free ends of the fingers of each element adjacent to but not overlapping the fingers of the other element, and with said fingers of each said element being substantially aligned with the spaces adjacent to said fingers of the other element.

2. The transducer of claim 1 wherein each said element includes a second arm substantially parallel to the first-mentioned arm and in conductive engagement with the free ends of each of said fingers of said element.

3. The transducer of claim 1 wherein said transducer is positioned on a ZnO/Si medium.

4. A single-phase transducer for use in a device having a surface acoustic wave coupled thereto, said transducer comprising a conductive arm and a plurality of conductive fingers electrically connected with and extending from said arm, said fingers being spaced from one another with the width of said fingers and the spacing therebetween each being equal to one-half of the wavelength of said surface acoustic wave.

5. The transducer of claim 1 wherein said transducer includes a second conductive arm parallel to said first mentioned arm and electrically connected with the ends of said fingers remote from said first mentioned arm.

6. The transducer of claim 4 wherein said transducer is on a ZnO/Si medium.

7. A separate comb transducer for use in a device having a surface acoustic wave coupled thereto, said transducer comprising first and second conductive elements each of which includes an arm and a plurality of fingers extending from said arm, said fingers being parallel to and spaced from one another, and said elements being positioned with the fingers of each element parallel to the fingers of the other element with the free ends of the fingers of each element adjacent to but not overlapping the fingers of the other element, and with said fingers of each said element being aligned with spaces adjacent to said fingers of the other element.

8. The transducer of claim 7 wherein each of said elements includes a second arm parallel to said first arm and in conductive engagement with the free ends of each of said fingers of said element.

9. The transducer of claim 7 wherein said elements are positioned on a ZnO/Si medium.

* * * * *

UNITED STATES PATENT AND TRADEMARK OFFICE
CERTIFICATE OF CORRECTION

PATENT NO. : 4,437,031
DATED : March 13, 1984
INVENTOR(S) : Gunshor et al

It is certified that error appears in the above—identified patent and that said Letters Patent is hereby corrected as shown below:

In the title, delete "ZNO" and insert --ZNO/Si--

Column 5, line 66, after "eliminated" insert --.--

Signed and Sealed this

Twentieth Day of November 1984

[SEAL]

*Attest:*

GERALD J. MOSSINGHOFF

*Attesting Officer*     *Commissioner of Patents and Trademarks*